(12) United States Patent
Kouchi

(10) Patent No.: US 10,180,692 B2
(45) Date of Patent: Jan. 15, 2019

(54) SEMICONDUCTOR DEVICE

(71) Applicant: TOSHIBA MEMORY CORPORATION, Minato-ku (JP)

(72) Inventor: Toshiyuki Kouchi, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 401 days.

(21) Appl. No.: 14/833,712

(22) Filed: Aug. 24, 2015

(65) Prior Publication Data

US 2016/0259352 A1 Sep. 8, 2016

Related U.S. Application Data

(60) Provisional application No. 62/128,034, filed on Mar. 4, 2015.

(51) Int. Cl.
| | |
|---|---|
| G05F 1/46 | (2006.01) |
| H01L 25/065 | (2006.01) |
| H01L 23/00 | (2006.01) |

(52) U.S. Cl.
CPC ............ *G05F 1/46* (2013.01); *H01L 25/0657* (2013.01); *H01L 24/05* (2013.01); *H01L 24/06* (2013.01); *H01L 24/13* (2013.01); *H01L 24/16* (2013.01); *H01L 24/17* (2013.01); *H01L 2224/05009* (2013.01); *H01L 2224/06181* (2013.01); *H01L 2224/13025* (2013.01); *H01L 2224/16145* (2013.01); *H01L 2224/16146* (2013.01); *H01L 2224/17181* (2013.01); *H01L 2225/06513* (2013.01); *H01L 2225/06541* (2013.01); *H01L 2225/06565* (2013.01)

(58) Field of Classification Search
CPC ...... G11C 5/06; G11C 5/14; G05F 1/46; H01L 25/0657
USPC .................................................. 365/63, 200
See application file for complete search history.

(56) References Cited

U.S. PATENT DOCUMENTS

| | | | |
|---|---|---|---|
| 2003/0062612 A1 | 4/2003 | Matsuo et al. | |
| 2005/0162946 A1 | 7/2005 | Koide | |
| 2005/0162950 A1 | 7/2005 | Koide | |
| 2009/0015291 A1* | 1/2009 | Kim .................. | G11C 7/1045 326/52 |
| 2010/0027309 A1* | 2/2010 | Park .................. | G11C 5/02 365/63 |

(Continued)

FOREIGN PATENT DOCUMENTS

| | | |
|---|---|---|
| JP | 2012-064891 | 3/2012 |
| JP | 2013-029448 | 2/2013 |
| JP | 2013-084697 | 5/2013 |

OTHER PUBLICATIONS

Taiwanese Office Action dated Sep. 21, 2016 in Patent Application No. 104126428 (with English Translation).

(Continued)

*Primary Examiner* — Tim T Vo
*Assistant Examiner* — Phong H Dang
(74) *Attorney, Agent, or Firm* — Oblon, McClelland, Maier & Neustadt, L.L.P.

(57) ABSTRACT

A semiconductor device of one embodiment includes semiconductor chips. While the semiconductor device is receiving a power supply and a chip enable signal which is negated, all external terminals of the semiconductor chips are at the same logic level.

20 Claims, 6 Drawing Sheets

(56) References Cited

U.S. PATENT DOCUMENTS

| | | | | |
|---|---|---|---|---|
| 2010/0200998 A1* | 8/2010 | Furuta | ............ | G11C 5/04 257/774 |
| 2011/0102066 A1* | 5/2011 | Jin | ............ | G11C 5/04 327/524 |
| 2012/0069530 A1 | 3/2012 | Inoue et al. | | |
| 2012/0126848 A1* | 5/2012 | Wu | ............ | G11C 5/02 326/21 |
| 2013/0155794 A1* | 6/2013 | Wu | ............ | G11C 29/802 365/200 |
| 2014/0062587 A1* | 3/2014 | Koyanagi | ............ | G06F 3/0688 327/595 |
| 2014/0254254 A1 | 9/2014 | Katayama et al. | | |
| 2014/0344613 A1* | 11/2014 | Byeon | ............ | H01L 23/544 713/500 |
| 2015/0348941 A1* | 12/2015 | Kim | ............ | H01L 25/0657 327/565 |

OTHER PUBLICATIONS

Combined Taiwanese Office Action and Search Report dated Jun. 26, 2017 in Taiwanese Patent Application No. 10620663640 (with English translation of Category of Cited Documents).

\* cited by examiner

SEMICONDUCTOR DEVICE

CROSS-REFERENCE TO RELATED APPLICATIONS

This application claims the benefit of U.S. Provisional Application No. 62/128,034, filed Mar. 4, 2015, the entire contents of which are incorporated herein by reference.

FIELD

Embodiments relate to a semiconductor device.

BACKGROUND

Semiconductor devices with stacked semiconductor chips therein are known.

DETAILED DESCRIPTION

A semiconductor device of one embodiment includes semiconductor chips. While the semiconductor device is receiving a power supply and a chip enable signal which is negated, all external terminals of the semiconductor chips are at the same logic level.

In general, semiconductor chips have their particular internal nodes fixed to a power supply potential or ground potential during the stand-by state. This is implemented by, for example, providing the input section of a node whose potential should be fixed with an AND gate. The AND gate receives an internal signal transmitted by that node at its one input node, and receives a stand-by control signal from outside the semiconductor chip at its other input node. The stand-by control signal is asserted during the stand-by state, and thereby the node of a target of potential fixation is fixed to the low level (ground potential).

Figure 1:
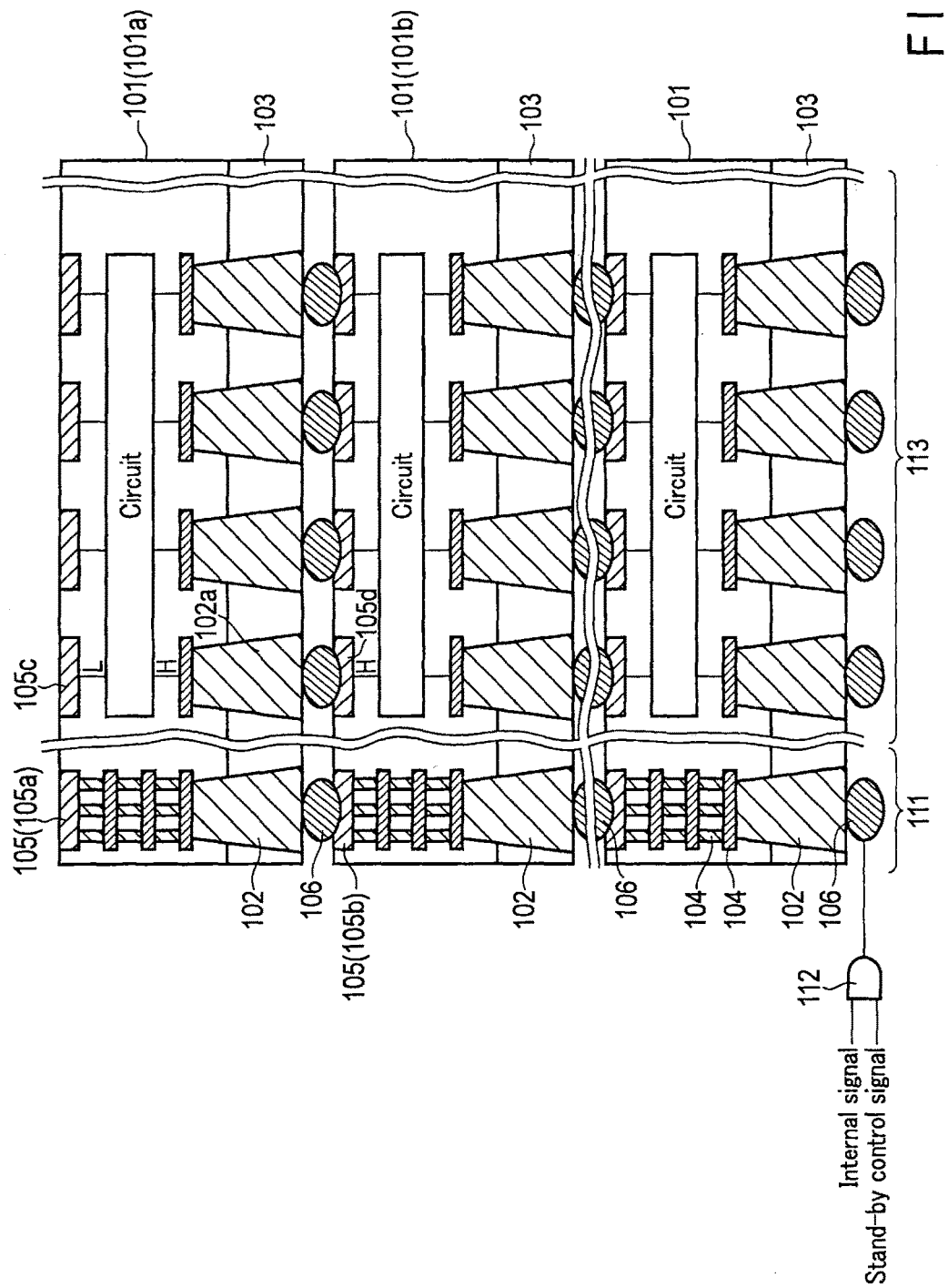
FIG. 1 illustrates a section of a semiconductor device for reference.

The semiconductor chips may be coupled to each other using a technique called through silicon via (TSV) to make part of a semiconductor device. An example of a section of such a semiconductor device is illustrated in FIG. 1. As illustrated in FIG. 1, semiconductor chips 101 are electrically coupled to each other with through vias 102. The through vias 102 are conductors which pierce through a substrate 103 in the semiconductor chips 101. The semiconductor chips 101 are electrically coupled with the through vias 102, interconnects and plugs 104 on the substrate 103, and terminals 105 and 106. This enables a signal received by a particular terminal 105a of a particular semiconductor chip 101a to be received by a terminal 105b of another semiconductor chip 101b.

The semiconductor chips 101 interconnected with the through vias may also be desired to have their particular nodes fixed to the power supply potential or the ground potential during the stand-by state. For example, with fixation of a node to the ground potential, when a through via 102 which makes part of that node is unintentionally short-circuited to the substrate 103, leakage current due to the short circuit can be suppressed during the stand-by state. To this end, each through via 102 is desired to be at the low level. This is easily implemented for a case where all the nodes have potentials that should be fixed at the same potential (or, logic level) as in an area 111. It can be implemented by providing an AND gate 112 for the nodes as in the case of one semiconductor chip.

In contrast, as in an area 113, terminals at the same position such as terminals 105c and 105d in different semiconductor chips 101a and 101b may need to receive signals of different logic levels. This requires a particular through via 102 (for example, the through via 102a) to be maintained at the high level. Therefore, all the through vias 102 cannot be fixed to the low level. This disables control of the leakage current resulting from through vias 102 which cannot be fixed to the low level and are short-circuited with the substrate 103 during the stand-by state.

Embodiments will now be described with reference to figures. In the following description, components having substantially the same functions and structure are labeled with the same reference sign and repeated explanation may be omitted.

Figure 2:
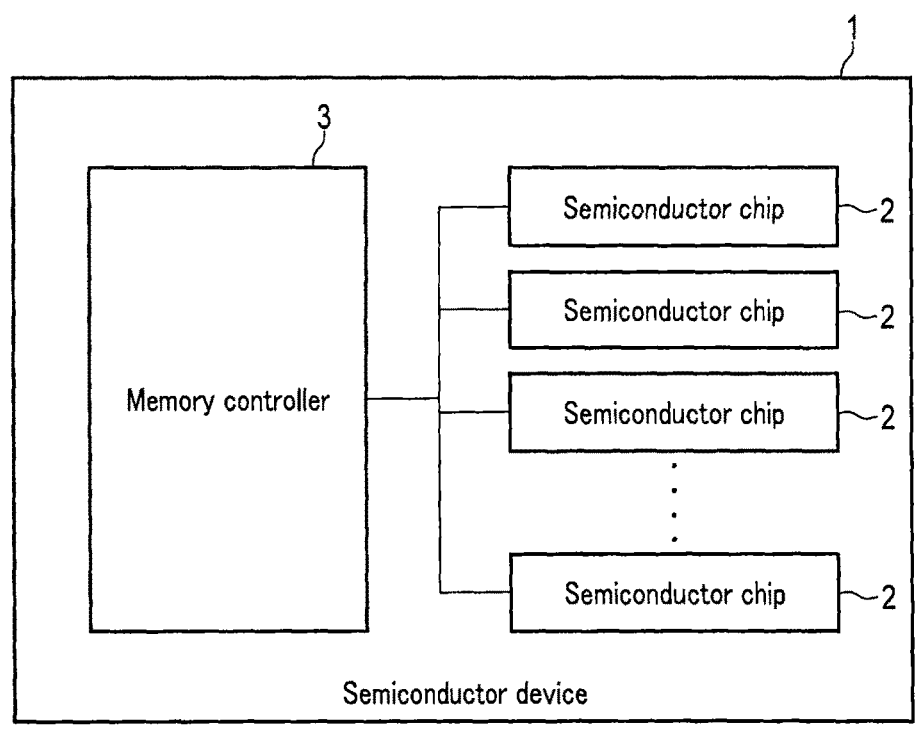
FIG. 2 is a block diagram of a semiconductor device of one embodiment.

FIG. 2 is a block diagram of a semiconductor device of one embodiment. The semiconductor device 1 includes plural semiconductor chips 2 (2_1 to 2_n) as illustrated in FIG. 2. n is, for example, sixteen, and the following description is based on an example of n being sixteen. The semiconductor device 1 includes a memory controller 3. The memory controller 3 controls each semiconductor chip 2 based on control from outside the semiconductor device 1. The memory controller 3 may be provided outside the semiconductor device 1.

Each semiconductor chip 2 is a chip of a semiconductor device. Each semiconductor chip 2 has functional blocks illustrated in FIG. 3. Some of the functions by an illustrated functional block may be performed by another functional block. Furthermore, an illustrated functional block may be divided into functional sub-blocks. Moreover, each functional block can be implemented as any of hardware (a circuit, a processor, etc.), computer software and a combination of the both.

Figure 3:
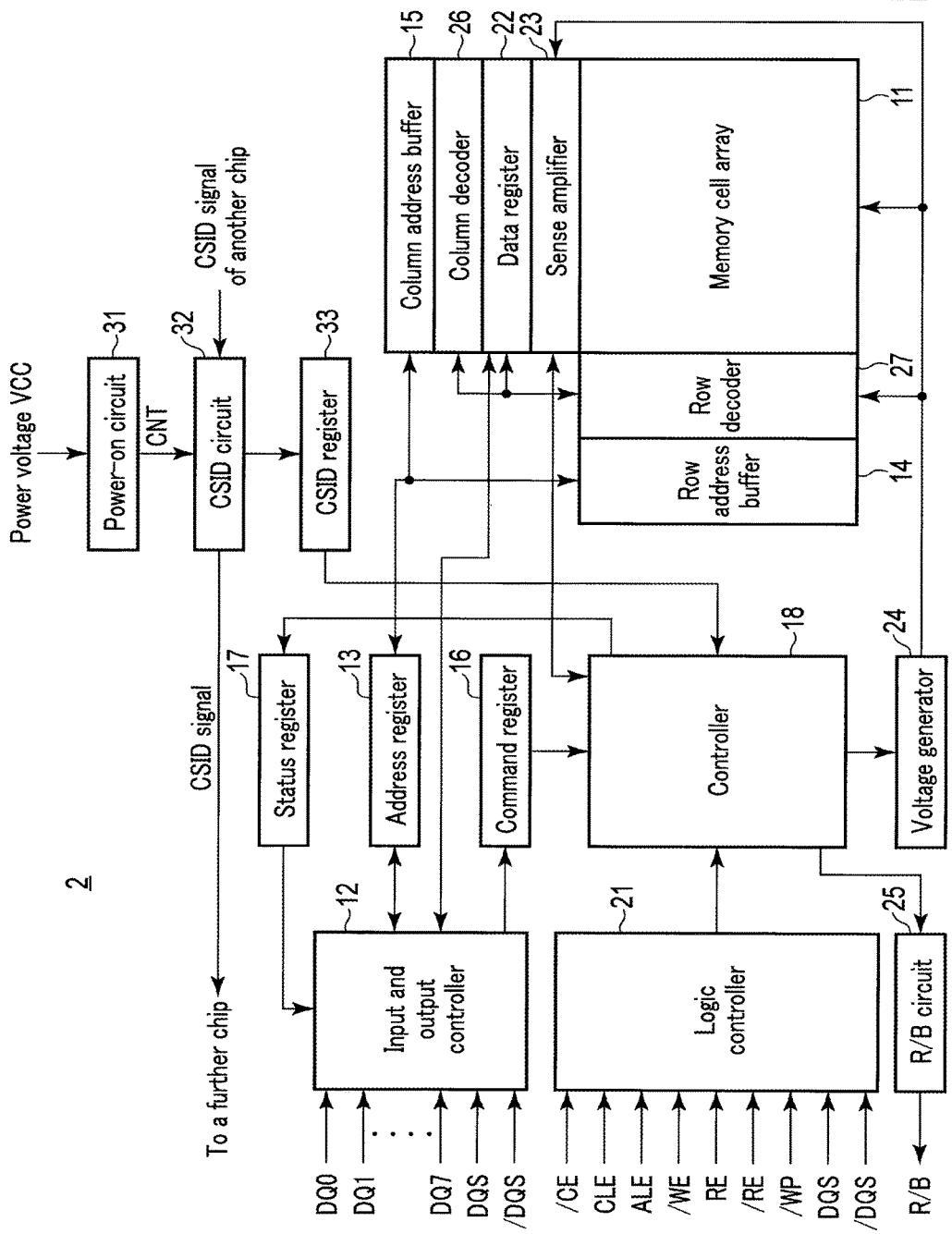
FIG. 3 is a block diagram of a semiconductor chip of one embodiment.

As illustrated in FIG. 3, each semiconductor chip 2 is supplied with a supply voltage VCC (power supply) from the memory controller 3 and operates with the supply voltage VCC. Each semiconductor chip 2 includes a memory cell array 11. The memory cell array 11 includes plural memory cells. A memory cell stores data, and includes, for example, a cell transistor. The memory cell array 11 includes further components, such as word lines and bit lines.

The input and output controller 12 receives signals DQ0 to DQ7. The signals DQ0 to DQ7 comprise a command, an address signal, or data. The input and output controller 12 receives a command, an address signal, and data from the memory controller 3, and outputs data. The input and output controller 12 receives strobe signals DQS and /DQS. The strobe signals DQS and /DQS specify timings at which the signals DQ0 to DQ7 should be taken in. The sign "/" at the head of a sign for specifying a signal indicates the inverted logic of the signal without the sign "/". Moreover, the sign "/" indicates a signal accompanied by the sign "/" is a negative logic, i.e., is asserted when it is at the low level.

The address signal output from the input and output controller 12 is latched by an address register 13. The latched address signal is supplied to a row address buffer 14 and a column address buffer 15. The command output from the input and output controller 12 is latched by a command register 16. A status register 17 stores values for specifying states of operations controlled by a controller 18, and status information.

The semiconductor chip 2 receives various control signals for controlling operations of the semiconductor chip 2 from outside, such as the memory controller 3. The control signals include a chip enable /CE, a command latch enable CLE, an address latch enable ALE, a write enable /WE, read enables RE and /RE, and a write protection /WP, for example. The control signals are received by the logic controller 21. The logic controller 21 controls the input and output controller 12 based on the control signals, and enables or disables the signals DQ0 to DQ7 to reach the address register 13, the command register 16, and the data register 22 as the address signal, the command, and the data, respectively.

The controller 18 receives the latched command from the command register 16. The controller 18 follows the received command to control blocks, such as a sense amplifier 23 and a voltage generator 24, to perform processes (reading, writing or erasing of data) instructed by the command. The controller 18 also manages output of a ready/busy signal R/B. Specifically, the controller 18 controls the R/B circuit 25 to output the ready/busy signal R/B indicative of a busy state while the semiconductor chip 2 is in the busy state.

The sense amplifier 23 reads data of the memory cells in the memory cell array 11 through the bit lines, and detects the states of the memory cells through the bit lines. The data register 22 temporarily stores data read from the sense amplifier 23 or data to be supplied to the sense amplifier 23. The voltage generator 24 generates voltages for writing, reading and erasing of data from the supply voltage VCC.

The column address buffer 15 temporarily stores the column address signal, and supplies the same to the column decoder 26. The column decoder 26 selects a bit line, etc. based on the received column address signal. The row address buffer 14 temporarily stores row address signal, and supplies the same to the row decoder 27. The row decoder 27 receives various voltages for reading, writing, or erasing of data from the voltage generator 24, and applies the voltages to particular word lines based on the row address signal.

The power-on circuit 31 uses a signal CNT to control enabling or disabling of the CSID circuit 32. The CSID circuit 32 receives a CSID signal from a CSID circuit 32 of another semiconductor chip 2. The CSID signal includes CS identification (ID) of a semiconductor chip 2 from which the signal is supplied, and has a value unique to that source semiconductor chip 2. The CSID circuit 32 receives the CSID signal indicating the CSID of another semiconductor chip 2, and generates, from the received CSID signal, the CSID of the semiconductor chip 2 in which the CSID circuit 32 is included. The generated CSID signal is output to another semiconductor chip 2, and is received by the CSID register 33.

The CSID register 33 stores the ID of the semiconductor chip 2 while the semiconductor chip 2 is receiving the supply voltage VCC. The CSID register 33 supplies a signal including the CSID to the controller 18.

Figure 4:
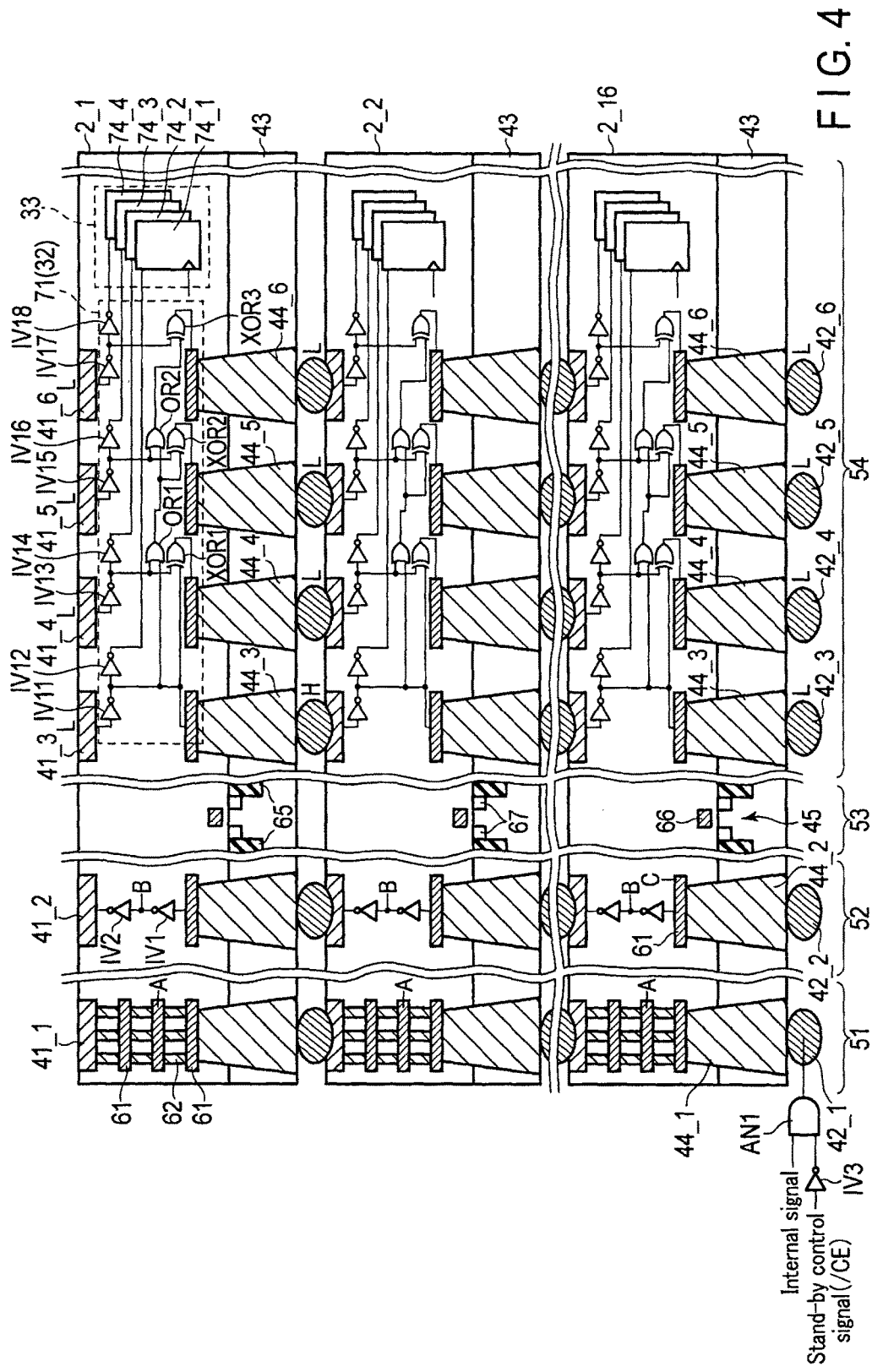
FIG. 4 illustrates a section of the semiconductor chip of one embodiment.

The semiconductor device 1 has a structure whose section is illustrated in FIG. 4. FIG. 4 illustrates, in part thereof, the structure of a circuit. As shown in FIG. 4, each semiconductor chip 2 includes conductive (external) terminals 41 (41_1 to 41_6). The terminals 41 are, for example, pads, and are exposed at a first surface (upper surface) of the semiconductor chips 2. Moreover, each semiconductor chip 2 includes conductive bumps (external terminals) 42 (42_1 to 42_6). The bumps 42 are provided at a second surface (lower surface) of the semiconductor chips 2. An external terminal refers to a terminal exposed outside of a semiconductor chip 2.

The semiconductor chips 2 are stacked. The semiconductor chips 2_1 to 2_16 are intended to receive the same or the same kinds of signals at the same terminals 41 (for example, terminals 41_1). To this end, the semiconductor chips 2 are coupled to each other as described in the following. Specifically, the semiconductor chip 2_$i$-1 (i being a natural number between 1 to n-1) is provided on a semiconductor chip 2_$i$. Each bump 42 of the semiconductor chip 2_$i$ is coupled to the corresponding terminal 41 of the semiconductor chip 2_$i$-1. Specifically, the terminal 41_1 of the semiconductor chip 2_$i$-1 is coupled to the bump 42_1 of the semiconductor chip 2_$i$, and similarly the terminal 41_$x$ (x being a natural number between 1 to 6) of the semiconductor chip 2_$i$-1 is coupled to the bump 42_$x$ of the semiconductor chip 2_$i$.

In each semiconductor chip 2, the terminal 41_1 makes a pair with the bump 42_1, and similarly the terminal 41_$x$ makes a pair with the bump 42_$x$. In other words, the signal received at each terminal 41 is output from the bump 42 which makes a pair with that terminal 41 with the same or inverted logic. Even if two semiconductor chips 2 receive signals of different logics at the same terminals 41 (for example, 41_4), the two signals received at the same terminals 41 are signals which have different logics but have the same function.

Each semiconductor chip 2 includes a substrate 43 of, for example, silicon. Each semiconductor chip 2 further includes plural conductive through vias 44 (44_1 to 44_6). The through vias 44 extend at least between the first surface (upper surface) and the second surface (lower surface) of the corresponding substrate 43, and project from the first surface, for example. Moreover, the through via 44_1 is coupled to the bump 42_1 at its bottom, and similarly the through via 44_$x$ is coupled to the bump 42_$x$.

Each semiconductor chip 2 includes areas 51, 52, 53, and 54. Each semiconductor chip 2 includes the terminal 41_1 and the bump 42_1 in the area 51. In the area 51, a signal received by the bump 42_1 is transmitted to the signal 41_1 as it is (with the same logic). The signal transmitted within the area 51 in each semiconductor chip 2 is received by functional blocks (see, FIG. 3) in that semiconductor chip through some patterns (not shown) of interconnects 61. Specifically, a signal on a node indicated as, for example, a node A is received by a particular functional block. For transmission of the signal of the same logic in the area 51, the terminal 41_1 and the bump 42_1 are electrically coupled by the through via 441, the interconnects 61, and conductive plugs 62. The interconnects 61 and the plugs 62 are provided between the top of the through via 44 and the terminal 41_1, and couple the through via 44 and the terminal 41_1. The signal may be received by the terminal 41_1 and output by the bump 42_1 as it is.

Each semiconductor chip 2 includes the terminal 41_2 and the bump 42_2 in the area 52. In each semiconductor chip 2, the signal received by the bump 42_2 passes through a logic gate, and is received by some functional blocks of that semiconductor chip 2. The signal which has passed through the logic gate may have had its logic inverted. Based on this, such an inverted signal is returned to the same logic as is received by the bump 42_2, and is transmitted to the terminal 412.

FIG. 4 illustrates an example in which the signal received by the bump 42_2 is taken at a node B through an inverter circuit IV1 and reaches the terminal 41_2 through an additional inverter circuit IV2. Specifically, the signal received by the bump 42_2 reaches the terminal 41_2 through an even number (in total) of (at least two) inverter circuits, including the one through which it passes to be used by a functional block.

The components and connections of logic gates between the terminal 41_2 and the through via 44_2 in the area 52 including inverter circuits IV1 and IV2 are, in actuality, implemented with transistors, the interconnects 61, and the plugs 62. The transistors are provided in a non-illustrated area in the area 52, and, for example, are those like the transistor 45 in the area 53.

Alternatively, the signal transmitted through the area 52 may be received by a functional block without its logic inverted. Specifically, the signal is taken at an interconnect 61 coupled to the through via 44_2 (i.e., a node C), and does not pass through a logic gate. In spite of this, logic gates are provided in the area 52 to allow the signal to go through logic inversions even-number of times. With this, a signal path in the area 52 is not coupled to one node, but is driven by logic gates (for example, inverter circuits IV1 and IV2). This can avoid the necessity of driving the whole signal path in the area 52 with one driver, and shorten a time for charging the signal path.

Not only in the area 52, in each semiconductor chip 2, all the areas in which a signal received at a particular bump 42 is used in that semiconductor chip 2 with its logic inverted are configured in the same manner as the area 52. Specifically, a signal reaches a corresponding terminal 41 after its logic is inverted an even number of times in total, including the inversion for being inverted to be used by a functional block.

Each semiconductor chip 2 includes plural transistors 45 in the area 53. FIG. 4 illustrates only one transistor 45. The transistor 45 is provided between element isolation insulators 65 in an area in the surface of the first surface of the substrate 43, and includes a gate electrode 66, and source/drain areas 67. The transistor 45 is used also for implementing various functional blocks of the semiconductor chip 2 illustrated in the FIG. 3.

Each semiconductor chip 2 includes a circuit 71 in the area 54 between the terminals 41_3 to 41_6 and the bumps 42_3 to 42_6. The circuit 71 transmits a signal of a logic the same as or opposite that of a signal received at a particular terminal 41 to a through via coupled to the bump 42 which makes a pair with that terminal 41. Whether each pair of the terminal 41 and the bump 42 transmit the signal of a logic the same as or opposite that of the signal received at the terminal 41 is based on the function of the circuit 71, in particular, the role of the transmitted signal. In the following, description will be made of an example in which the circuit 71 is at least part of the CSID circuit 32, and FIG. 4 illustrates such an example. In the following description, the circuit 71 is cited as the CSID circuit 32.

The circuit 71 of each semiconductor chip 2 receives signals from the bumps 42_3 to 42_6. The signals received by the bump 42_3 to 42_6 of a semiconductor chip 2_i include a bit string of CSID of the semiconductor chip 2_i−1. The CSID circuit 32 of each semiconductor chip 2 generates a bit string which indicates its own CSID from the signals received by the bumps 42_3 to 42_6. The CSID of each semiconductor chip 2 needs to be unique, and the bit string of each CSID is generated by the CSID circuit 32 from the bit string of the CSID of another semiconductor chip 2.

An example of the CSID circuit 32 will now be described. The CSID circuit 32 of each semiconductor chip 2 includes inverter circuits IV11 to IV18, OR gates OR1 and OR2, and exclusive OR (XOR) gates XOR1 and XOR2. The components and connections between the pad 42_3 to 42_6 and through vias 44_3 to 44_6 including the inverter circuits IV11 to IV18, OR gates OR1 and OR2 and the exclusive OR (XOR) gates XOR1 and XOR2 are implemented with the transistors 45, interconnects 61, and plugs 62 in actuality.

The terminal 41_3 is coupled to the input of the inverter circuit IV11. The output of the inverter circuit IV11 is coupled to the input of the inverter circuit IV12, a first input of the OR gate OR1, and a first input of the XOR gate XOR1. The output of the inverter circuit IV11 is also coupled to the through via 44_3 through the interconnect 61.

The terminal 41_4 is coupled to the input of the inverter circuit IV13. The output of the inverter circuit IV13 is coupled to the input of inverter circuit IV14, the second input of the OR gate OR1, and a second input of the XOR gate XOR1. The output of the OR gate OR1 is coupled to the first input of the OR gate OR2, and a first input of the XOR gate XOR2. The output of the XOR gate XOR1 is coupled to the through via 44_4 via the interconnect 61.

The terminal 41_5 is coupled to the input of the inverter circuit IV15. The output of the inverter circuit IV15 is coupled to the input of the inverter circuit IV16, a second input of the OR gate OR2, and a second input of the XOR gate XOR2. The output of the OR gate OR1 is coupled to a first input of the OR gate OR3. The output of the XOR the gate XOR2 is coupled to the through via 44_5 via the interconnect 61.

The terminal 41_6 is coupled to the input of the inverter circuit IV17. The output of the inverter circuit IV17 is coupled to the input of the inverter circuit IV18, and a second input of XOR gate XOR3. The output of the XOR gate XOR3 is coupled to the through via 44_6 via the interconnect 61.

With such a CSID circuit 32, in any semiconductor chip 2, a logic level of inversion of a logic level at at least one of the terminals 41_3 to 41_6 is output at the bump 42 which makes a pair with that at least one terminal. As a result, in each semiconductor chip 2, the bit string of its CSID is obtained. The details are as follows. First, the terminals 41_3 to 41_6 of the semiconductor chip 2_1 are all fixed to the low level. The logic levels at the terminals 41_3 to 41_6 of the semiconductor chip 2_1 are maintained or inverted by the CSID circuit 32. As a result, the terminals 41_3 to 41_6 of each semiconductor chip 2 are applied with a set of the low levels and high levels.

The state of the low level is treated as "0" bit, and the logic levels at the terminals 413 to 416 are respectively used as the most significant to the fourth most significant bits of the bit string of CSID, and thereby the CSID of "0000" is obtained in the semiconductor chip 2_1. In the current context, the sixteen semiconductor chips 2 are provided as described above, and, based on this, four-bit CSIDs allow for a unique CSID in each semiconductor chip 2. Specifically, the CSID "1000" is obtained in the semiconductor chip 2_i, and CSID "1111" is obtained in the semiconductor chip 216. The levels of the bumps 42_3 to 42_6 of the semiconductor chip 2_16 are all low. Therefore, the levels at the bumps 42_3 to 42_6 of the semiconductor chip 216 are the same as those at the terminals 41_3 to 41_6 of the semiconductor chip 2_1, respectively.

In each semiconductor chip 2, the bit string of its CSID is stored in its CSID register 33. Specifically, the CSID register 33 of each semiconductor chip 2 includes as many latch circuits 74 (74_1 to 74_4) as the number of bits in the bit string of the CSID. The latch circuit 74_1 receives the same logic level as that at the terminal 41_3. Similarly, the latch circuits 74_2 to 74_4 receive the same logic levels as those at the terminals 41_4 to 41_6, respectively. FIG. 4 illustrates an example in which the latch circuits 74_1 to 74_4 receive the outputs of inverter circuits IV12, IV14, IV16, and IV18, respectively. The latch circuits 74 supply the stored values (bits) to the controller 18.

As described above, each CSID circuit 32 is enabled or disabled by the power-on circuit 31. As a method for this, one or more of the logic gates (IV11 to IV18, OR1, OR2, XOR1, and XOR2) in the CSID circuit 32 can be enabled or disabled, for example. When a logic gate to be switched is enabled, it operates, and when disabled, it does not operate (does not output a signal). The switching of enabling or disabling of a logic gate is performed by the power-on circuit 31. The switching of the state of the CSID circuit 32 may be performed by supply or interruption of the supply voltage VCC to the CSID circuit 32 by the power-on circuit 31. Specifically, the supply of the supply voltage VCC to one or more of the inverter circuits IV11 to IV18, the OR gates OR1 and OR2, and the XOR gates XOR1 to XOR3 is interrupted.

Not only in the area 53 but in the area 53, all the areas in each semiconductor chip 2 which transmit a signal which is received at a particular bump 42 and needs to be output from the corresponding terminal 41 at the logic opposite that at the bump 42 are configured in the same manner as the area 53. Specifically, a signal is stored in a latch with the received logic, and a logic gate is disabled after the latching.

In the semiconductor chip 2_16, one or more of bumps 42 included in the path for transmission of a signal with the same logic between the semiconductor chips 2, such as bumps and 42_1 and/or 42_2 are coupled to an AND gate AN1. The AND gate AN1 is included in, for example, the memory controller 3, and the semiconductor chip 2_16 receives the output of the AND gate AN1 from the memory controller 3. The AND gate AN1 receives an internal signal of the semiconductor device 1 which is to be transmitted through the bump 42_1. The AND gate AN1 further receives a stand-by control signal through an inverter IV3. The inverter IV3 is included in, for example, the memory controller 3.

The stand-by control signal is generated by the memory controller 3. The stand-by control signal is asserted at least while the chip enable signal /CE is asserted, and is negated at least while the chip enable signal /CE is negated. The stand-by signal is the same signal as the chip enable signal /CE, for example. Alternatively, the stand-by control signal is a signal different from the chip enable signal /CE and generated based on the chip enable signal /CE.

Figure 5:
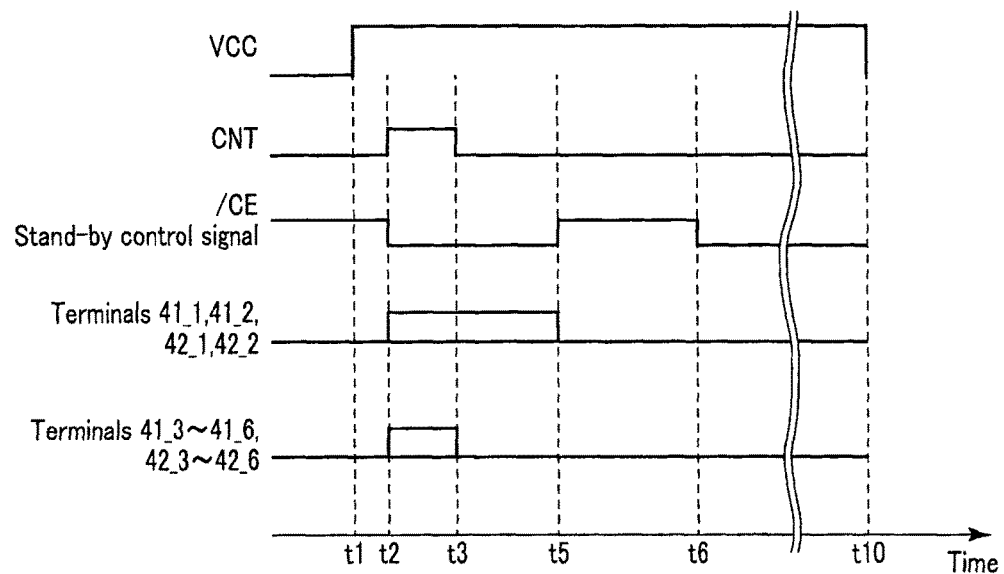
FIG. 5 illustrates the states of some nodes in the semiconductor device of one embodiment over time.

The operation of the semiconductor device 1 will now be described with reference to FIG. 5. FIG. 5 illustrates potentials of some portions of the semiconductor device 1 of one embodiment.

The semiconductor device 1 is provided with the supply voltage VCC from outside, such as the memory controller 3, at time t1. The semiconductor device 1 starts operation with the start of the supply of the supply voltage VCC. With the start of operation, the power-on circuit 31 enables the CSID circuit 32 at time t2. As an example for this, FIG. 5 illustrates that the control signal CNT from the power-on circuit 31 is asserted. With the transition to the enable state, in the CSID circuit 32 of each semiconductor chip 2, a bit string of CSID of that semiconductor chip 2 is generated, and the generated bit string is stored in the CSID register 33 of that semiconductor chip 2 based on the control of the power-on circuit 31. Specifically, in each semiconductor chip 2, the outputs of the inverter circuits IV12, IV14, IV16 and IV18 are stored in the latch circuits 74_1, 74_2, 74_3 and 74_4, respectively. At time t2, the chip enable signal /CE, and in turn the stand-by control signal are also asserted.

The power-on circuit 31 disables the CSID circuit 32 once the bit string of the CSID is taken in (once a sufficient time elapses after the instruction of taking the bit string into the latch circuits). The disabling of the CSID circuit 32 is shown as an example in which the control signal CNT is negated at time t3 in FIG. 5. The disabling of the CSID circuit 32 is performed, for example, to inhibit at least logic gates coupled to the through vias 44 from operating. As a result, at least the disabled logic gates of the CSID circuit 32 (i.e., one or more or all of the inverter circuits IV11-IV18, the OR gates OR1 and OR2, and the XOR gates XOR1 and XOR2) do not perform outputting. As a result, the outputs of the disabled logic gates of the CSID circuit 32 are fixed to the low level.

The disabling of the CSID circuit 32 suppresses the leakage current in the CSID circuit 32. In particular, in a case where a path for leakage current between a through via 44 and the substrate 43 is unintentionally formed, the current which flows through this path can be suppressed.

After time t3 and elapse of a particular time after the start of the supply voltage VCC to the semiconductor device 1, the semiconductor device 1 shifts to a state in which it can operate. Once the semiconductor device 1 shifts to the operational state, the semiconductor device 1 operates through the control by the controller 18 based on the control signals, data and address signal from outside. During the operation of the semiconductor device 1, signals flow through in the areas 51 and 52 and are received by various functional blocks. The CSID register 33 keeps storing the bit string of the CSID until the supply of the supply voltage VCC to the semiconductor device 1 stops. The storing of the bit string of the CSID by the CSID register 33 continues also in the stand-by state. After the CSID circuit 32 is disabled, the controller 18 obtains the bit string of the CSID with reference to the CSID register 33 when the controller 18 needs the CSID.

After time t3, such as at time t5, the chip enable signal /CE and therefore the stand-by control signal is negated to make the semiconductor chip 2 transition to the stand-by state. The stand-by state is a state in which the semiconductor device 1 receives the supply voltage VCC but is not operating. The stand-by state is the same state as that in which the chip enable signal /CE and therefore the stand-by control signal is negated, for example. The stand-by state continues until time t6.

The CSID circuit 32 is maintained to be disabled also during the stand-by state. For this reason, also while the semiconductor device 1 is in the stand-by state, the leakage current in the CSID circuit 32 can be suppressed. During the stand-by state, any signal which is received at a bump 42 and can be output from the terminal 41 which makes a pair with that bump 42 with the same logic as that when received at that bump 42 (for example, any signal in areas 51 and 52) is fixed to a low level. In other words, such a signal is not output, with the same mechanism as that by the AND gate AN1 shown to the area 51, from the corresponding AND gate. As a result, in each semiconductor chip 2, signals of the same logic as that when received at bumps 42 can be output from the corresponding terminals 41. The pairs of the bump 42 and terminal 41, and through vias 44 and interconnects 61 therebetween and plugs 62 therebetween are fixed to the low level. The fixation to the low level suppresses the leakage current. In particular, in a case in which a path for leakage current between a through via 44 fixed to the low level, such as through vias 44_1 and/or 44_2, and the substrate 43 is unintentionally formed, the current which flows through this path can be suppressed.

At time t10 after time t6, the supply of the supply voltage VCC to the semiconductor device 1 stops. The CSID circuit 32 operates only once after the start of the supply of the supply voltage VCC (i.e., between time t2 and t3), and it does not operate until the stop of the supply of the supply voltage VCC after that (i.e., time t10).

Figure 6:
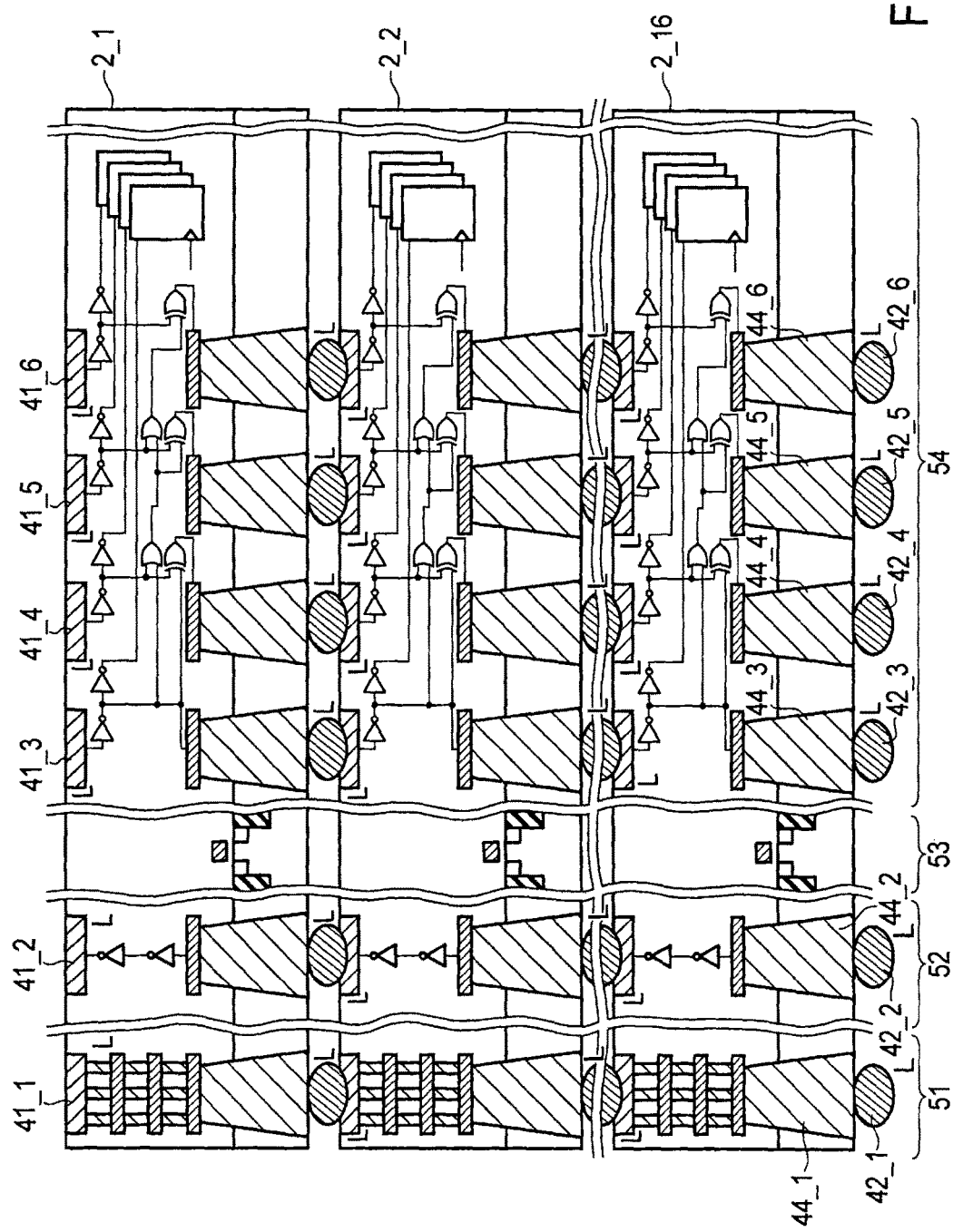
FIG. 6 illustrates one state of the semiconductor device of one embodiment.

Thus, in an area in which a signal which is received at a bump 42 and can be output from the terminal 41 which makes a pair with that bump 42 with the same logic as that when received at that bump 42 (for example, areas 51 and 52), all bumps 42 are maintained at the low level. For this reason, in such an area, not only the bumps 42 but all the terminals 41 are at the low level during the stand-by state. In contrast, signals are stored in the latches 74 in an area in which a signal cannot be output from the terminal 41 which makes pair with a bump 42 with the same logic as that when received by that bump 42 (for example, area 54). In addition, in such an area, the logic gates through which signals flow are disabled after the signals are stored, such as during the stand-by state. For this reason, also in such an area, all the bumps 42 and terminals 41 are maintained at the low level during the stand-by state. Thus, all the terminals are maintained at the low level as illustrated in FIG. 6 during the stand-by state.

The description so far relates to the fixation of all the terminals to the low level during the stand-by state. The terminals may be, however, fixed to the high level.

As described, in each semiconductor chip 2 of one embodiment, a signal used in that semiconductor chip 2 with the logic opposite that when received at a particular bump 42 reaches the corresponding terminal 41 after it is inverted an even number of times in total. Moreover, a signal carried over plural semiconductor chips 2 with the same logic is transmitted from a bump 42 to the corresponding terminal 41 after being logically-inverted an even number of times in each semiconductor chip 2. The bumps 42 and the terminals 41 can be fixed to the low level during the stand-by state. This can suppress unintentional leakage current from flowing through the through vias 44 coupled to such bumps 42 and terminals 41.

Moreover, in each semiconductor chip 2 of one embodiment, a signal which needs to be output with the logic opposite that when received at a particular bump 42 from the corresponding terminal 41 is stored in the latch circuit 74. After the latching, logic gates which contribute to transmission and generation of the signal are disabled. For this reason, the nodes which transmit such a signal are fixed at the low level after the latching, and therefore leakage current flowing through such nodes, or a through via 44 in particular, can be suppressed. The suppression of the leakage current continues even while the semiconductor device 1 is in the stand-by state. Therefore, the leakage current especially during the stand-by state can be suppressed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
semiconductor chips, each of which comprises:
a plurality of first external terminals at a first side of a corresponding semiconductor chip of the semiconductor chips;
a plurality of second external terminals at a second side of the corresponding semiconductor chip, the second side being opposite to the first side;
a plurality of through vias inside the corresponding semiconductor chip, the through vias connected to the second external terminals at one ends, respectively, and extending toward the first external terminals;
a logic circuit inside the corresponding semiconductor chip, the logic circuit connecting other ends of the through vias and the first external terminals, respectively, such that each of signal lines between the through vias and the first external terminals includes at least one inverter circuit; and
a latch circuit inside the corresponding semiconductor chip, the latch circuit configured to latch data of the signal lines between the through vias and the first external terminals, wherein
upon power-on of the semiconductor device, signals are propagated from the first external terminals of an uppermost semiconductor chip to the second external terminals of a lowermost semiconductor chip through the logic circuits of all the semiconductor chips, without any external input to the signal lines, and
after the signals have been propagated so that the latch circuits of all the semiconductor chips latch data of the respective signal line, and the logic circuits of all the semiconductor chips are inactivated, while the semiconductor device is receiving a power supply and the semiconductor chips are receiving from outside the semiconductor chips a chip enable signal which is negated, all external terminals of the semiconductor chips are at the same logic level.

2. The device of claim 1, wherein:
the latch circuit of a first semiconductor chip of the semiconductor chips stores the same logic level as a logic level at one of the first external terminals of the first semiconductor chip.

3. The device of claim 2, wherein:
the first semiconductor chip further comprises:
a second terminal of all the external terminals,
the logic circuit of the first semiconductor chip generates a logic level of inversion of the logic level at the one of the first external terminals of the first semiconductor chip at one of the second external terminals of the first semiconductor chip; and
the first semiconductor chip further comprises a controller which disables the logic circuit of the first semiconductor chip after the latch circuit of the first semiconductor chip starts the storing of the same logic level as the logic level at the one of the first external terminals.

4. The device of claim 3, wherein:
the same logic level at all of the first and second external terminals of the semiconductor chips is a low level.

5. The device of claim 1, wherein:
the logic circuit of a first semiconductor chip of the semiconductor chips generates the same logic level as a logic level at one of the first external terminals of the first semiconductor chip at one of the second external terminals of the first semiconductor chip.

6. The device of claim 1, wherein:
the first external terminals of each of a subset of the semiconductor chips excluding the uppermost semiconductor chip and the lowermost semiconductor chip are coupled to the second external terminals of another of the subset of the semiconductor chips on a one-to-one basis.

7. The device of claim 6, wherein:
the latch circuit of each of the semiconductor chips stores the same logic level as a logic level at one of the first external terminals of that semiconductor chip.

8. The device of claim 7, wherein:
the logic circuit of each of the semiconductor chips generates a logic level of inversion of the logic level at the one of the first external terminals of that semiconductor chip at one of the second external terminals of that semiconductor chip; and
each of the semiconductor chips further comprises a controller which disables the logic circuit of the corresponding semiconductor chip after the latch circuit of the corresponding semiconductor chip starts the storing of the same logic level as the logic level at the one of the first external terminals of the corresponding semiconductor chip.

9. The device of claim 3, wherein:
the same logic level at all of the first and second external terminals of the semiconductor chips is a low level.

10. A semiconductor device comprising:
semiconductor chips, each of which comprises:
   a plurality of first external terminals at a first side of a corresponding semiconductor chip of corresponding semiconductor chips;
   a plurality of second external terminals at a second side of the corresponding semiconductor chip, the second side being opposite to the first side;
   a plurality of through vias inside the corresponding semiconductor chip, the through vias connected to the second external terminals at one ends, respectively, and extending toward the first external terminals; and
   a logic circuit inside the corresponding semiconductor chip, the logic circuit connecting other ends of the through vias and the first external terminals, respectively, such that each of signal lines between the through vias and the first external terminals includes at least one inverter circuit, the logic circuit generating a logic level of inversion of a logic level at one of the first external terminals at one of the second external terminals; and
   a latch circuit inside the corresponding semiconductor chip, the latch circuit configured to latch data of the signal lines between the through vias and the first external terminals, wherein
upon power-on of the semiconductor device, signals are propagated from the first external terminals of an uppermost semiconductor chip to the second external terminals of a lowermost semiconductor chip through the logic circuits of all the semiconductor chips, without any external input to the signal lines, and
after the signals have been propagated so that the latch circuits of all the semiconductor chips latch data of the respective signal line, and the logic circuits of all the semiconductor chips are inactivated, while the semiconductor device is receiving a power supply and the semiconductor chips are receiving from outside the semiconductor chips a chip enable signal which is negated, all of the first and second external terminals of the semiconductor chips are at the same logic level.

11. The device of claim 10, wherein:
the latch circuit of a first semiconductor chip of the semiconductor chips stores the same logic level as a logic level at one of the first external terminals of the first semiconductor chip.

12. The device of claim 11, wherein:
the first semiconductor chip further comprises a controller which disables the logic circuit of the first semiconductor chip after the latch of the first semiconductor chip starts the storing of the same logic level as the logic level at the one of the first external terminals.

13. The device of claim 12, wherein
the same logic level at all of the first and second external terminals of the semiconductor chips is a low level.

14. The device of claim 10, wherein
the logic circuit of a first semiconductor chip of the semiconductor chips generates the same logic level as a logic level at one of the first external terminals of the first semiconductor chip at one of the second external terminals of the first semiconductor chip.

15. The device of claim 10, wherein
the first external terminals of each of a subset of the semiconductor chips excluding the uppermost semiconductor chip and the lowermost semiconductor chip are coupled to the second external terminals of another of the subset of the semiconductor chips on a one-to-one basis.

16. The device of claim 15, wherein:
the latch circuit of each of the semiconductor chips stores the same logic level as a logic level at one of the first external terminals of that semiconductor chip.

17. The device of claim 16, wherein
the logic circuit of each of the semiconductor chips generates a logic level of inversion of the logic level at the one of the first external terminals of that semiconductor chip at one of the second external terminals of that semiconductor chip; and
each of the semiconductor chips further comprises a controller which disables the logic circuit of the corresponding semiconductor chip after the latch of the corresponding semiconductor chip starts the storing of the same logic level as the logic level at the one of the first external terminals of the corresponding semiconductor chip.

18. The device of claim 17, wherein:
the same logic level at all of the first and second external terminals of the semiconductor chips is a low level.

19. A semiconductor device comprising:
semiconductor chips, each of which comprises:
a plurality of first external terminals at a first side of a corresponding semiconductor chip of the semiconductor chips;
a plurality of second external terminals at a second side of the corresponding semiconductor chip, the second side being opposite to the first side;
a plurality of through vias inside the corresponding semiconductor chip, the through vias connected to the second external terminals at one ends, respectively, and extending toward the first external terminals;

a logic circuit inside the corresponding semiconductor chip, the logic circuit connecting other ends of the through vias and the first external terminals, respectively, such that each of signal lines between the through vias and the first external terminals includes at least one inverter circuit, the logic circuit generating a logic level of inversion of the logic level at one of the first external terminals at one of the second external terminals;

a latch circuit inside the corresponding semiconductor chip, the latch circuit configured to latch data of the signal lines between the through vias and the first external terminals, the latch starting a process to store the same logic level as the logic level at the one of the first external terminals upon the semiconductor device starting to receive a power supply; and a controller which disables the logic circuit of the corresponding semiconductor device after the latch circuit of the corresponding semiconductor chip starts the storing of the same logic level as the logic level at the one of the first external terminals of the corresponding semiconductor chip, wherein upon power-on of the semiconductor device, signals are propagated from the first external terminals of an uppermost semiconductor chip to the second external terminals of a lowermost semiconductor chip through the logic circuits of all the semiconductor chips, without any external input to the signal lines, and after the signals have been propagated so that the latch circuits of all the semiconductor chips latch data of the respective signal line, and the logic circuits of all the semiconductor chips are inactivated, while the semiconductor device is receiving a power supply and the semiconductor chips are receiving from outside the semiconductor chips a chip enable signal which is negated, all of the first and second external terminals of the semiconductor chips are at the same logic level.

20. A semiconductor device comprising:
semiconductor chips, each of which comprises:
a plurality of first external terminals at a first side of a corresponding semiconductor chip of the semiconductor chips;
a plurality of second external terminals at a second side of the corresponding semiconductor chip, the second side being opposite to the first side;
a plurality of through vias inside the corresponding semiconductor chip, the through vias connected to the second external terminals at one ends, respectively, and extending toward the first external terminals;
a logic circuit inside the corresponding semiconductor chip, the logic circuit connecting other ends of the through vias and the first external terminals, respectively, such that each of signal lines between the through vias and the first external terminals includes at least one inverter circuit; and
a latch circuit inside the corresponding semiconductor chip, the latch circuit configured to latch data of the signal lines between the through vias and the first external terminals, wherein
the semiconductor chips are stacked and coupled through the first and second external terminals,
upon power-on of the semiconductor device, signals are propagated from the first external terminals of an uppermost semiconductor chip to the second external terminals of a lowermost semiconductor chip through the logic circuits of all the semiconductor chips, without any external input to the signal lines, and
after the signals have been propagated so that the latch circuits of all the semiconductor chips latch data of the respective signal line, and the logic circuits of all the semiconductor chips are inactivated, while the semiconductor device is receiving a power supply and the semiconductor chips are receiving from outside the semiconductor chips a chip enable signal which is negated, all of the first and second external terminals of the semiconductor chips are at the same logic level.

* * * * *